(12) United States Patent
Andrabi et al.

(10) Patent No.: US 9,705,712 B2
(45) Date of Patent: Jul. 11, 2017

(54) HIGHLY LINEAR-GAIN OSCILLATOR

(75) Inventors: Shuja Hussain Andrabi, Cambridge (GB); Hashem Zare-Hoseini, Cambridge (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 600 days.

(21) Appl. No.: 13/310,156

(22) Filed: Dec. 2, 2011

(65) Prior Publication Data
US 2013/0141176 A1 Jun. 6, 2013

(30) Foreign Application Priority Data
Dec. 2, 2011 (GB) .................................. 1120780.0

(51) Int. Cl.
*H03B 5/08* (2006.01)
*H04L 27/00* (2006.01)
*H03B 5/12* (2006.01)
*H03L 7/099* (2006.01)

(52) U.S. Cl.
CPC ....... *H04L 27/0014* (2013.01); *H03B 5/1215* (2013.01); *H03B 5/1228* (2013.01); *H03B 5/1243* (2013.01); *H03B 5/1278* (2013.01); *H03B 2200/0092* (2013.01); *H03J 2200/10* (2013.01); *H03L 7/099* (2013.01); *H04L 2027/0016* (2013.01); *H04L 2027/0055* (2013.01); *H04L 2027/0071* (2013.01)

(58) Field of Classification Search
CPC ............... H03B 5/08; H03B 1/00; H03B 1/09
USPC ....... 331/167, 177 V, 16, 34, 116 R, 116 FE, 331/117 FE, 117 R
See application file for complete search history.

(56) References Cited

U.S. PATENT DOCUMENTS

| | | | |
|---|---|---|---|
| 8,305,151 B2 * | 11/2012 | Tanabe | ............ 331/117 FE |
| 2007/0146088 A1 * | 6/2007 | Arai et al. | ............ 331/167 |
| 2008/0278250 A1 | 11/2008 | Hung et al. | |
| 2009/0302958 A1 | 12/2009 | Sakurai et al. | |

* cited by examiner

*Primary Examiner* — Arnold Kinkead
(74) *Attorney, Agent, or Firm* — Procopio, Cory, Hargreaves & Savitch LLP

(57) ABSTRACT

A variable frequency oscillator includes an inductance unit having a first inductance, a first variable capacitor coupled across the inductance unit, and a second variable capacitor coupled across a part of the inductance unit. The inductance of the part of the inductance unit coupled by the second variable capacitor is a proportion of the first inductance.

15 Claims, 5 Drawing Sheets

-- Prior art --

-- Prior art --

HIGHLY LINEAR-GAIN OSCILLATOR

BACKGROUND OF THE INVENTION

This invention relates to oscillators, in particular oscillators whose operating frequency can be varied in response to an input.

There is a need for low-cost and highly efficient transmitters for a wide class of radio communication and measurement devices. Phased-Locked-Loops (PLLs) are integral to radio frequency ("RF") systems for generating an output signal having a predetermined frequency and/or phase relationship with a reference signal. The PLL comprises an oscillator device for generating a desired frequency signal. Such an oscillator device may be a digitally controlled oscillator (DCO) or a voltage controlled oscillator (VCO). In systems that use PLLs for the direct modulation of a transmit signal, e.g. continuous-wave (CW) FM in radar or polar modulations, the linearity of the oscillator gain $K_v$ becomes very important. Nonlinearity in $K_v$ can cause a drop in the modulation accuracy as well as corrupting the spectrum of the transmit signal.

In an example application, polar modulation transmitters have seen increased demand in recent years due to low cost and higher efficiency. Polar modulation requires a highly linear phase modulator, and especially so for a wideband application. This linearity is at least partially related to the oscillator gain linearity. However, oscillator gain in many actual designs suffer from nonlinearity because of dependence of the gain on the frequency. In some systems, nonlinearity in the oscillator gain directly affects the modulation accuracy (EVM) and transmit spectrum (ACP).

Prior systems and methods to improve the linearity of the oscillator gain include a pre-distortion method (look-up table based nonlinearity compensation), delay line-based compensation and analogue and/or digital real-time frequency compensation circuits. These prior systems and methods can be circuit intensive, costly, and have power and area penalty.

Thus there is need for improving the linearity of oscillator gain in an easier, more efficient and economic manner.

SUMMARY OF THE INVENTION

According to a first embodiment of the invention, there is provided a variable frequency oscillator comprising: an inductance unit having a first inductance; a first variable capacitor coupled across the inductance unit; a second variable capacitor coupled across a part of the inductance unit, the inductance of said part being a proportion of the first inductance.

The oscillator may have an operating frequency range and the proportion may be such as to substantially minimise the variation of gain of the oscillator over the operating frequency range.

The proportion may be such as to substantially maximise the linearity of the gain of the oscillator.

The proportion may be such that the derivative of the oscillator gain is substantially minimum at said proportion.

The part may have a second inductance, the relationship between the first and second inductances may be such as to substantially minimise the variation of gain of the oscillator over the or an operating frequency range.

The gain of the oscillator may be dependent on the change in frequency of the oscillator with respect to the change in capacitance of the first and/or second variable capacitors.

The variance of the oscillator gain may be dependent on the change in the gain with respect to the change in the capacitance of the first and/or second variable capacitors.

The capacitance of the first and second variable capacitor may be variable for varying the frequency of the oscillator.

The capacitance of the first and/or second variable capacitor may be variable by means of the voltage applied to the capacitor(s).

The capacitance of the second variable capacitor may be less than the capacitance of the first variable capacitor.

The inductance of the part may be less than the first inductance.

The oscillator may further comprise a controller configured to select an operating frequency, the operating frequency being selectable over an operating frequency range.

The oscillator may be a voltage controlled oscillator or a digitally controlled oscillator.

The oscillator may further comprise a pair of cross coupled field effect transistors, one of said transistors being coupled to a terminal of the inductance unit and the other transistor being coupled to the other terminal of the inductance unit.

A phase-locked loop comprising the above described variable frequency oscillator may be provided.

BRIEF DESCRIPTION OF THE DRAWINGS

The present invention will now be described by way of example, with reference to the accompanying drawings, in which.

DETAILED DESCRIPTION OF THE INVENTION

In general, an oscillator can be implemented around an oscillating circuit such as an LC resonator. The frequency of the oscillator can be a function of L and C. For example, in a LC based VCO the frequency of oscillation can be changed by changing the capacitance of the capacitor across the tank. This can lead to a non-linear dependence of the VCO gain on the frequency as explained below.

For the sake of illustration, a DCO is used when describing the prior art and embodiments of the present invention. However, the same principles describing the prior art and the embodiments of the present invention also apply to analogue VCOs and other similar oscillators.

Figure 1:
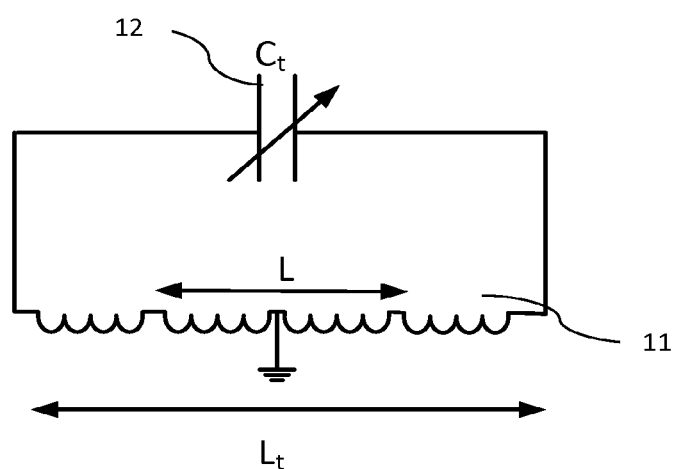
FIG. 1 shows a conventional prior art LC tank.
Figure 2:
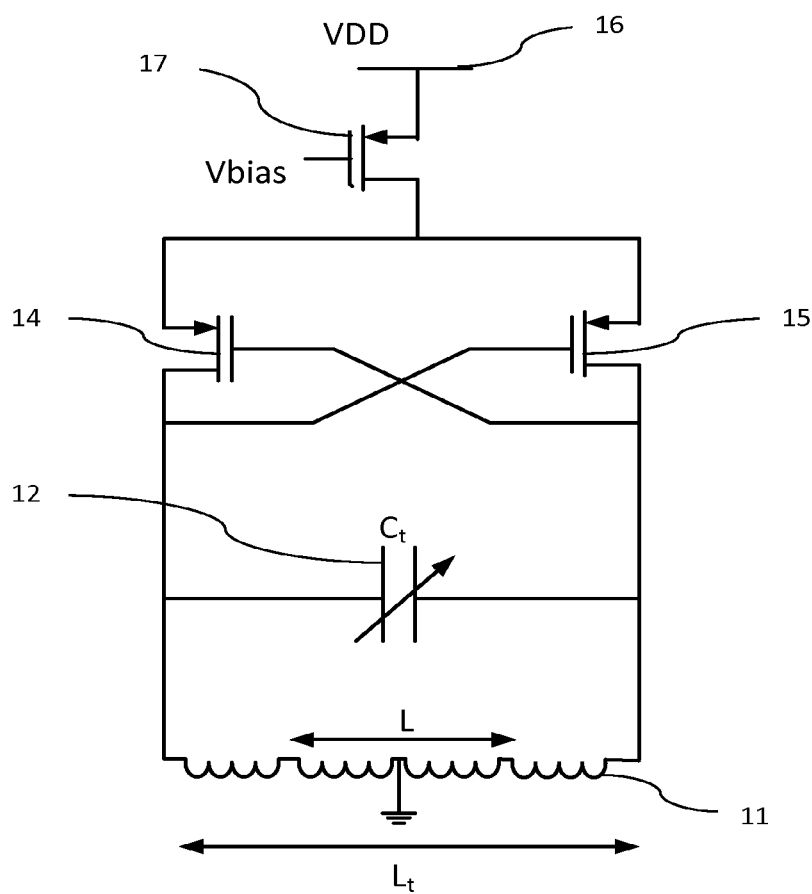
FIG. 2 shows a conventional prior art VCO core comprising the LC tank of FIG. 1.

The general structure of a prior art oscillator LC tank 10 is shown in the FIG. 1, which comprises an inductance source 11 and a variable capacitor 12 coupled across the inductance source 11. This LC tank 10 along with an active circuit builds a conventional VCO core 13 as shown in FIG. 2. The active circuit comprises a pair of cross coupled field effect transistors 14 and 15, a power supply 16 and a current source 17.

In a conventional LC tank 10, as shown in FIG. 1, the oscillation frequency $\omega_0$ and its derivative with respect to the capacitance C is:

$$\omega_0 = \frac{1}{\sqrt{LC_t}} \Rightarrow K_v \triangleq \frac{d\omega_0}{dC} \quad (1)$$

$$= -\frac{L}{2}\omega_0^3$$

As can be seen in equation (1), $K_v$, the gain of the oscillator, is dependent on cubic of $\omega_0$. This means that the gain varies over the tuning frequency range and the more the tuning range, the more gain variation. Intuitively this can be seen by observing that the gain is changed by adding/subtracting a $C_{lsb}$, to the capacitance $C_t$ and as the result, the normalized capacitance change is $C_{lsb}/C_t$. Hence, for a higher $C_t$ (i.e. lower $\omega_0$), the normalized capacitance step is smaller (i.e. smaller $K_v$) and vice versa.

Figure 3:
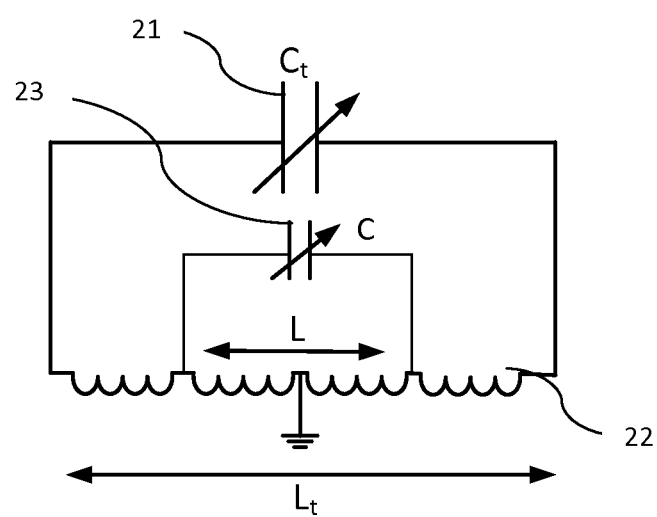
FIG. 3 shows a proposed LC tank according to an embodiment of the present invention.

An embodiment of the present invention is shown in FIG. 3. In the LC tank 20 shown in FIG. 3, the capacitance is divided into two parts. A capacitance $C_t$, which can be provided by a first variable capacitor 21, is connected across the whole of an inductance source $L_t$, which can be provided by an inductance unit 22. The inductance unit 22 can comprise one or more inductors. The capacitance $C_t$ and inductance $L_t$ can be used to set the centre frequency of the oscillator. A capacitance C, which may be provided by a second variable capacitor 23, is connected across a part of the inductance source $L_t$ (i.e. a part of the inductance unit 22), the part being indicated by L. The capacitance C connected across the part of the inductance source L may be smaller than the capacitance $C_t$ connected across the whole inductance source $L_t$.

The second variable capacitor 23 can be coupled across a part of the inductance unit 22 such that the inductance of said part is a proportion of the whole inductance of the inductance unit 22. Thus the inductance L coupled to the second variable capacitor can be smaller than the whole inductance $L_t$. The inductance unit 22 may comprise more than one inductor element connected in series or the inductance unit 22 can be a single inductor element. The second variable capacitor 23 can be connected, for example, at an end of an inductor element and/or at a point along an inductor coil of the element.

Figure 4:
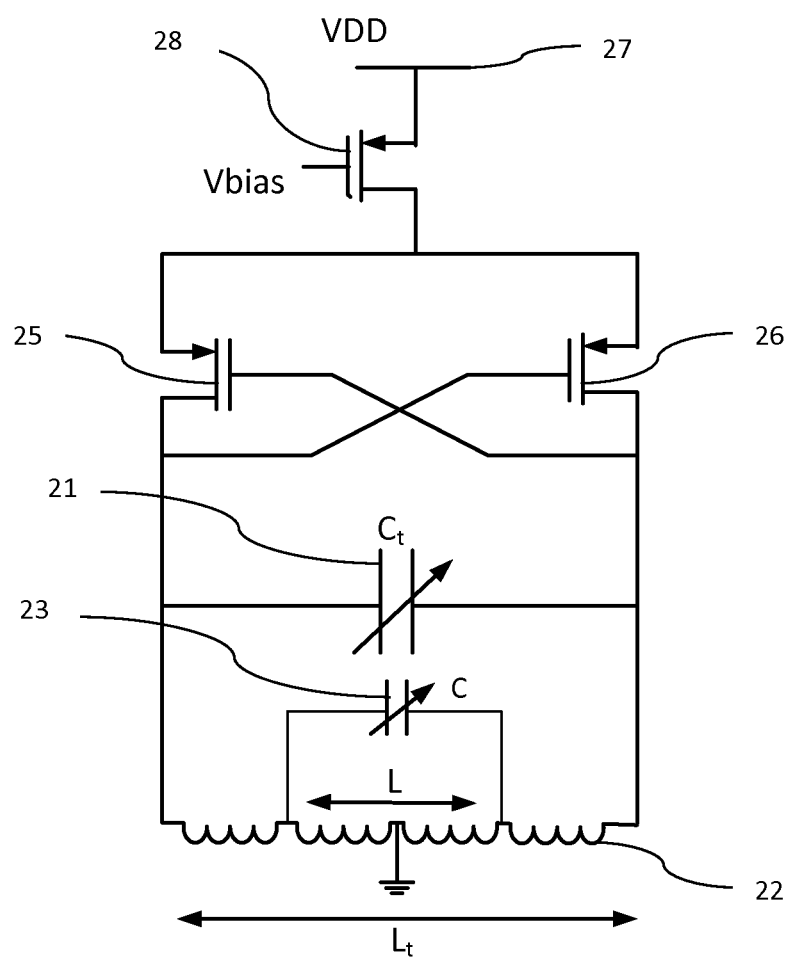
FIG. 4 shows a proposed oscillator comprising the LC tank of FIG. 3.

The LC tank 20 shown in FIG. 3 along with an active circuit can be used to build an oscillator core 24 as shown in FIG. 4. The active circuit comprises a pair of cross coupled field effect transistors 25 and 26, a power supply 27 and a current source 28. Transistor 25 can be coupled to one terminal of the inductance unit 22 and transistor 26 can be coupled to the other terminal of inductance unit 22. The oscillator core 24 can be implemented in a VCO or DCO, for example. The frequency range at which the oscillator operates may be determined by the capacitance $C_t$ and inductance $L_t$. The capacitance of the first and second variable capacitors can be varied by a controller. The controller can select an operating frequency by varying the capacitances of the first and/or second variable capacitors. The capacitances of the first and/or second variable capacitors can be varied by applying a voltage to the capacitors. The controller may determine the frequency range from which the operating frequency can be selected from. The smaller capacitance C (provided by the second variable capacitor 23) can be used for fine frequency tuning.

In an example derivation, the small inner LC tank (i.e. the second variable capacitor 23 and the part of the inductance that the second variable capacitor 23 is coupled to) can be replaced by an effective inductance $L_e$:

$$L_e = \frac{L}{1 - \omega_0^2 LC} \quad (2)$$

In this example derivation, the inner LC tank can be represented by an effective inductance $L_e$ as long as $\omega_0 LC<1$. This is true as $\omega_0$ is the resonance frequency of the total circuit with the larger capacitance of $L_t C_t \gg LC$.

The derivative of the $L_e$ with respect to capacitance is:

$$\frac{dL_e}{dC} = \frac{L^2 \omega_0^2}{(1 - \omega_0^2 LC)^2} \quad (3)$$

On the other hand, the derivative of the resonance frequency $\omega_0$ with respect to inductance is:

$$\frac{d\omega_0}{dL} = -\frac{C_t}{2}\omega_0^3 \quad (4)$$

Using equations (3) and (4), the derivative of the resonance frequency $\omega_0$ with respect to capacitance for the tank circuit 20 is:

$$K_v = \frac{d\omega_0}{dC} \quad (5)$$

$$= -\frac{C_t}{2}\omega_0^3 \frac{L\omega_0^2}{(1 - \omega_0^2 LC)^2}$$

$$= -\frac{C_t}{2} \frac{L\omega_0^5}{(1 - \omega_0^2 LC)^2}$$

Reducing the nonlinearity can be achieved by minimising the DCO gain variation, i.e. $d\omega_0$ ($\omega_0$ step) variation with respect to dC (capacitance steps). In other words, an almost constant $d\omega_0/dC$ is required. This may be done by finding the global minimum of function $K_v = d\omega_0/dC$ by solving $d^2\omega_0/d^2C=0$.

For example, an improvement can be observed by comparing equation (1) and (5). In the conventional LC tank 10 represented by equation (1), $K_v = d\omega_0/dC$ is not constant and is changing with $\omega_0^3$. This means for a fixed step size of dC, when capacitance C increases, $K_v$ is reduced with the factor of $\omega_0^3$.

For the LC tank 20 shown in FIG. 3 and its $K_v$ represented by equation (5), when capacitance increases (i.e. $\omega_0$ decreases), the numerator decreases by $\omega_0^5$. In the denominator, when capacitance increases, $\omega_0^2 LC$ term increases as the rate of capacitance increase is much higher than the rate of $\omega_0^2$ decrease. Hence, the denominator is decreased. As a result, when capacitance is increasing both the numerator and denominator are decreasing with different rates. These different rates depend on the value of L, $L_t$, C and $C_t$. The value of $C_t$ and $L_t$ is determined by the required resonance frequency and the value of C and L is determined by the required $d\omega_0(K_v)$. The inventors have found that one way of changing the rates in the denominator and the numerator is to change the ratio of L to $L_t$, or $\alpha = L/L_t$.

Figure 5:
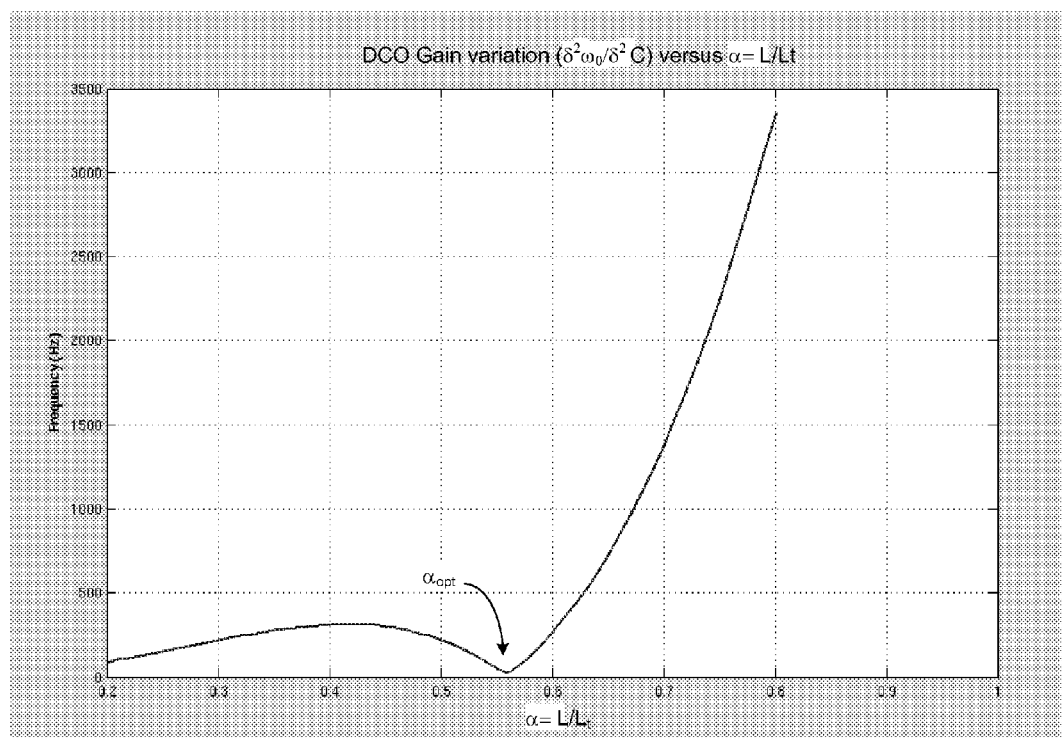
FIG. 5 shows an example of the gain variation verses $\alpha=L/L_t$ for the proposed DCO.

For a certain value of $L/L_t$ both the denominator and numerator decrease almost at the same rate and hence $K_v = d\omega_0/dC$ is almost constant with minimum variation. This can be seen in FIG. 5 which shows $K_v$ variation versus $\alpha=L/L_t$ for an example of the proposed circuit. There are 2 global minimums in $K_v$ variation function versus $\alpha$. The first minimum is when $\alpha=L/L_t=0$ which means the inner LC tank is not present (and hence there is no gain in the system). The second global minimum is at a value of $\alpha_{opt}=L/L_t$. $\alpha_{opt}$ is the optimum point in which $K_v$ variation (i.e. $d\omega_0/dC$ variation) is minimum. Thus, a proportion of $L_t$ can be selected or provided for L so as to substantially minimise the oscillator gain variation (or the nonlinearity of the gain). Thus such a relationship between L and $L_t$ can be used to substantially minimise the oscillator gain variation. This minimised gain variation may be across an operating frequency range.

In an example comparison between the conventional and proposed circuits, the size of the inductor can be identical ($L_t$ in FIGS. 1-4). The size of the total capacitance ($C+C_t$) in the proposed circuit (shown in FIGS. 3 and 4) can be bigger than the capacitance of the conventional circuit (shown in FIGS. 1 and 2) to achieve the same $K_v$ gain. This capacitance increase is not a problem for several reasons:

1. The total size of the LC tank is almost determined by the size of the inductors and the proposed circuit has the same size of inductor as the conventional circuit.
2. The increase in capacitance size is negligible. This is due to the fact that the total capacitance is dominated by $C_t$ which is much bigger than C.
3. An increase in C can lead to an increase in $C_{lsb}$. In some applications for fine tuning, the size of $C_{lsb}$ is small and it creates matching issues. In the proposed circuit, as $C_{lsb}$ is bigger (in order to achieve the same $K_v$), matching between the capacitors is better and it gives even more linearity.

In terms of power consumption, both conventional and proposed circuits are similar.

The proposed circuit provides a simple linearization technique with no extra power consumption penalty. It can also be used along with other techniques for even more improvement in oscillator gain linearity.

Providing a small inner LC tank can increase the linearity of the oscillator gain. The inventors have found that the improvement in linearity is optimal when the inductance of the inner LC tank is a certain proportion of the total inductance of the outer LC tank. The optimal proportion (i.e. $\alpha_{opt}$) can vary for different oscillators having different specifications. For example, an oscillator required to operate within a frequency range may comprise an inner and outer LC tank with different variable capacitance and inductance values to that of an oscillator required to operate within a different frequency range. The optimal proportion may be that at which the oscillator gain variation is minimum or that at which the linearity of the oscillator gain is maximum. Such properties may vary between different oscillators. Similarly, the optimal proportion at which the derivative of the oscillator gain is minimum may vary between different oscillators. The optimal proportion for differing oscillators can be obtained by performing various analysis such as the analysis described above to locate the global minimum on $K_v$ variation function versus $\alpha$.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems discloses herein, and without limitation to the scope of the claims. The applicants indicate that aspects of the present invention may consist of any such feature or combination of features. In view of the foregoing description it will be evident to a person skilled in the art that various modifications may be made within the scope of the invention.

The invention claimed is:

1. A variable frequency oscillator comprising:
   an inductance unit having a first inductance;
   a first variable capacitor coupled across the inductance unit; and
   a second variable capacitor coupled across a part of the inductance unit, the inductance of said part being a proportion of the first inductance;
   the oscillator having an operating frequency range and the proportion being such as to substantially minimise the variation of rate of change of an operating frequency of the oscillator with a variation of a capacitance of at least one of the first variable capacitor and the second variable capacitor.

2. A variable frequency oscillator as claimed in claim 1, the proportion being such as to substantially maximise the linearity of the rate of change of the operating frequency of the oscillator.

3. A variable frequency oscillator as claimed in claim 1, the proportion being such that the derivative of the rate of change of the operating frequency of the oscillator is substantially minimum at said proportion.

4. A variable frequency oscillator as claimed in claim 1, said part having a second inductance, the relationship between the first and second inductances being such as to substantially minimise the variation of rate of change of the operating frequency of the oscillator over the operating frequency range.

5. A variable frequency oscillator as claimed in claim 1, the rate of change of the operating frequency of the oscillator being dependent on the change in frequency of the oscillator with respect to the change in capacitance of the first and/or second variable capacitors.

6. A variable frequency oscillator as claimed in claim 1, the variance of the oscillator rate of change of operating frequency being dependent on the change in the rate of change of an operating frequency with respect to the change in the capacitance of the first and/or second variable capacitors.

7. A variable frequency oscillator as claimed in claim 1, the capacitance of the first and second variable capacitor being variable for varying the frequency of the oscillator.

8. A variable frequency oscillator as claimed in claim 1, the capacitance of the first and/or second variable capacitor being variable by means of the voltage applied to the capacitor(s).

9. A variable frequency oscillator as claimed in claim 1, the capacitance of the second variable capacitor being less than the capacitance of the first variable capacitor.

10. A variable frequency oscillator as claimed in claim 1, the inductance of said part being less than the first inductance.

11. A variable frequency oscillator as claimed in claim 1, further comprising a controller configured to select an operating frequency, the operating frequency being selectable over an operating frequency range.

12. A variable frequency oscillator as claimed in claim 1, the oscillator being a voltage controlled oscillator or a digitally controlled oscillator.

13. A variable frequency oscillator as claimed in claim 1, the oscillator further comprising a pair of cross coupled field effect transistors, one of said transistors being coupled to a terminal of the inductance unit and the other transistor being coupled to the other terminal of the inductance unit.

14. A phase-locked loop comprising a variable frequency oscillator as claimed in claim 1.

15. A variable frequency oscillator as claimed in claim 1, wherein the first inductance is fixed.

* * * * *